(12) United States Patent
Huang et al.

(10) Patent No.: US 11,974,422 B2
(45) Date of Patent: Apr. 30, 2024

(54) SEMICONDUCTOR DEVICE

(71) Applicant: Taiwan Semiconductor Manufacturing Company, Ltd., Hsinchu (TW)

(72) Inventors: Huai-Ying Huang, New Taipei (TW); Yu-Ming Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 163 days.

(21) Appl. No.: 17/668,392

(22) Filed: Feb. 10, 2022

(65) Prior Publication Data
US 2023/0140731 A1  May 4, 2023

Related U.S. Application Data

(60) Provisional application No. 63/275,938, filed on Nov. 4, 2021.

(51) Int. Cl.
| | | |
|---|---|---|
| *G11C 16/26* | (2006.01) | |
| *G11C 11/4091* | (2006.01) | |
| *G11C 11/419* | (2006.01) | |
| *H10B 10/00* | (2023.01) | |
| *H10B 12/00* | (2023.01) | |
| *H10B 41/40* | (2023.01) | |
| *H10B 43/40* | (2023.01) | |

(52) U.S. Cl.
CPC .......... *H10B 10/18* (2023.02); *G11C 11/4091* (2013.01); *G11C 11/419* (2013.01); *G11C 16/26* (2013.01); *H10B 12/50* (2023.02); *H10B 41/40* (2023.02); *H10B 43/40* (2023.02)

(58) Field of Classification Search
CPC ........ H10B 10/18; H10B 12/50; H10B 41/40; H10B 43/40; H10B 10/125; H01L 27/0688
USPC .............................................. 365/207, 230.06
See application file for complete search history.

(56) References Cited

U.S. PATENT DOCUMENTS

| | | | | |
|---|---|---|---|---|
| 8,385,122 | B2 * | 2/2013 | Kim ........................ | H10B 41/20 |
| | | | | 365/185.11 |
| 9,853,053 | B2 * | 12/2017 | Lupino ............. | H01L 27/11803 |
| 11,043,500 | B1 * | 6/2021 | Li .......................... | H01L 23/528 |
| 11,081,474 | B1 * | 8/2021 | Hoang ................... | G11C 16/10 |
| 2001/0017798 | A1 * | 8/2001 | Ishii ........................ | G11C 16/10 |
| | | | | 257/E27.099 |

(Continued)

FOREIGN PATENT DOCUMENTS

| | | | | |
|---|---|---|---|---|
| JP | 3615046 | B2 * | 1/2005 | |
| JP | 4068337 | B2 * | 3/2008 | ............. G11C 11/15 |

(Continued)

*Primary Examiner* — Michael T Tran
(74) *Attorney, Agent, or Firm* — JCIPRNET

(57) ABSTRACT

A semiconductor device includes a semiconductor substrate, ground level circuitry, a plurality of stacked memory arrays and a plurality of sense amplifier units. The ground level circuitry is disposed on the semiconductor substrate. The stacked memory arrays are disposed at an elevated level over the ground level circuitry. The sense amplifier units are disposed on the semiconductor substrate and electrically coupled to the stacked memory arrays, wherein at least a portion of each of the sense amplifier units is disposed at the elevated level over the ground level circuitry.

20 Claims, 14 Drawing Sheets

(56) References Cited

U.S. PATENT DOCUMENTS

| | | | |
|---|---|---|---|
| 2009/0086525 A1* | 4/2009 | Park | G11C 5/02 365/94 |
| 2009/0250678 A1* | 10/2009 | Osano | H10N 70/826 257/E47.001 |
| 2010/0020583 A1* | 1/2010 | Kang | G11C 29/14 365/51 |
| 2010/0195364 A1* | 8/2010 | Riho | G11C 5/04 365/63 |
| 2013/0088920 A1* | 4/2013 | Huang | G11C 16/04 365/185.17 |
| 2013/0148402 A1* | 6/2013 | Chang | G11C 8/08 365/63 |
| 2013/0176763 A1* | 7/2013 | Ware | H01L 23/5384 365/51 |
| 2013/0292852 A1* | 11/2013 | Fuergut | H01L 21/568 257/E23.141 |
| 2014/0003177 A1* | 1/2014 | In Chul | G11C 7/18 365/207 |
| 2014/0185392 A1* | 7/2014 | Schaefer | G11C 11/4091 365/189.011 |
| 2015/0032962 A1* | 1/2015 | Buyuktosunoglu | G06F 12/0811 711/122 |
| 2015/0121052 A1* | 4/2015 | Emma | G06F 9/44 713/1 |
| 2015/0287706 A1* | 10/2015 | Sukekawa | H01L 27/088 257/532 |
| 2017/0352679 A1* | 12/2017 | Chen | H10B 43/27 |
| 2017/0358334 A1* | 12/2017 | Onuki | G11C 7/1018 |
| 2018/0122825 A1* | 5/2018 | Lupino | H01L 27/11898 |
| 2019/0267074 A1* | 8/2019 | Fishburn | H01L 27/0688 |
| 2019/0363129 A1* | 11/2019 | Yokoyama | H01L 25/0657 |
| 2020/0051614 A1* | 2/2020 | Derner | G11C 5/025 |
| 2020/0212041 A1* | 7/2020 | Machkaoutsan | G11C 11/4045 |
| 2021/0143211 A1* | 5/2021 | Hiblot | H01L 24/94 |
| 2021/0265308 A1* | 8/2021 | Norman | G11C 5/025 |
| 2022/0028830 A1* | 1/2022 | Kirby | H01L 24/08 |
| 2022/0084578 A1* | 3/2022 | Li | G11C 11/4091 |
| 2022/0108985 A1* | 4/2022 | Nagatsuka | H01L 27/1251 |
| 2022/0157387 A1* | 5/2022 | Hara | G11C 16/3404 |
| 2022/0157886 A1* | 5/2022 | Chuang | H01L 21/76816 |
| 2022/0236785 A1* | 7/2022 | Yamazaki | G06F 1/3296 |
| 2022/0238491 A1* | 7/2022 | Onuki | G11C 11/4094 |
| 2022/0343954 A1* | 10/2022 | Aoki | G11C 7/08 |
| 2023/0005526 A1* | 1/2023 | Suthram | H01L 25/0655 |

FOREIGN PATENT DOCUMENTS

| | | | |
|---|---|---|---|
| TW | 202331728 A * | 8/2023 | G06F 3/0619 |
| WO | WO-2012155115 A1 * | 11/2012 | G11C 5/025 |
| WO | WO-2021173209 A1 * | 9/2021 | G11C 5/025 |

* cited by examiner

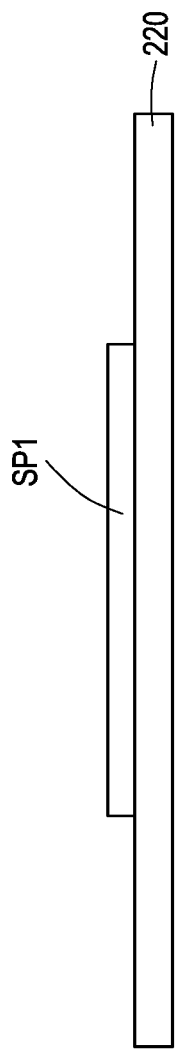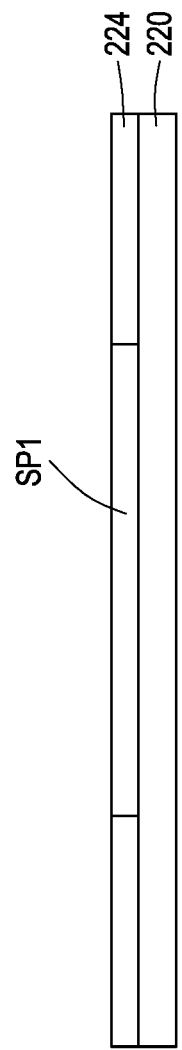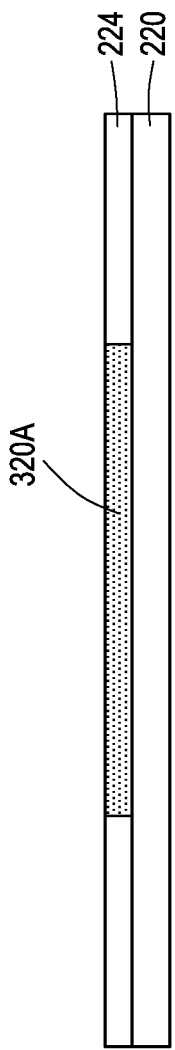

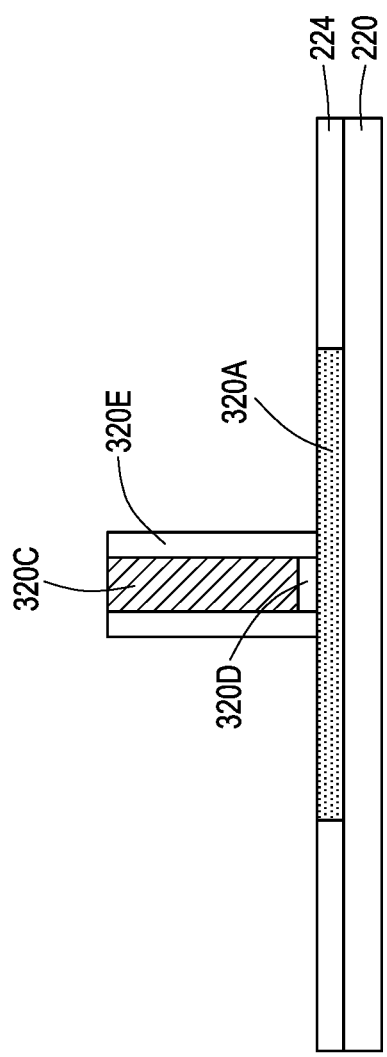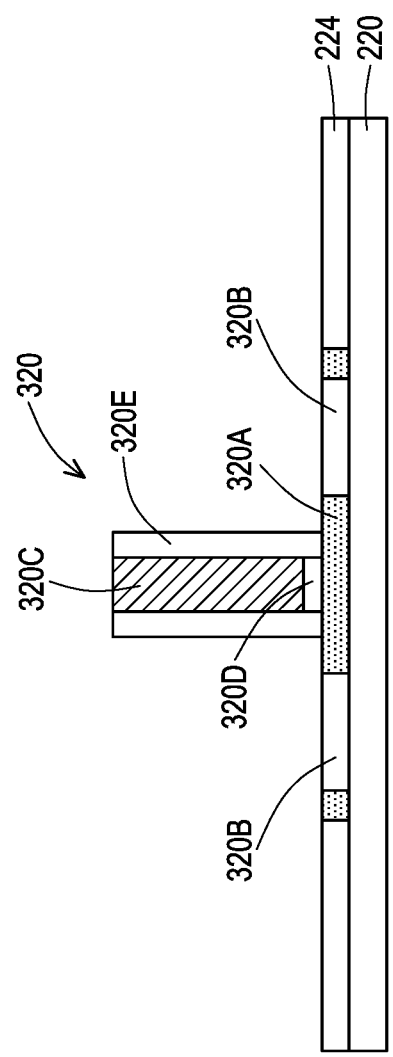
FIG. 4D
FIG. 4E

SEMICONDUCTOR DEVICE

CROSS-REFERENCE TO RELATED APPLICATION

This application claims the priority benefit of U.S. provisional applications Ser. No. 63/275,938, filed on Nov. 4, 2021. The entirety of the above-mentioned patent application is hereby incorporated by reference herein and made a part of this specification.

BACKGROUND

New semiconductor applications are ever changing our lives, from new smartphones, to healthcare, factory automation and artificial intelligence. Memory working in background plays an important role in enabling these technologies, and has drawn considerable interest along with advances in computing architectures and semiconductor technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A to FIG. 4E are cross-sectional views illustrating structures at various stages of manufacturing a transistor at an elevated level over the semiconductor substrate in accordance with some embodiments of the present disclosure.

DETAILED DESCRIPTION

Figure 1A:
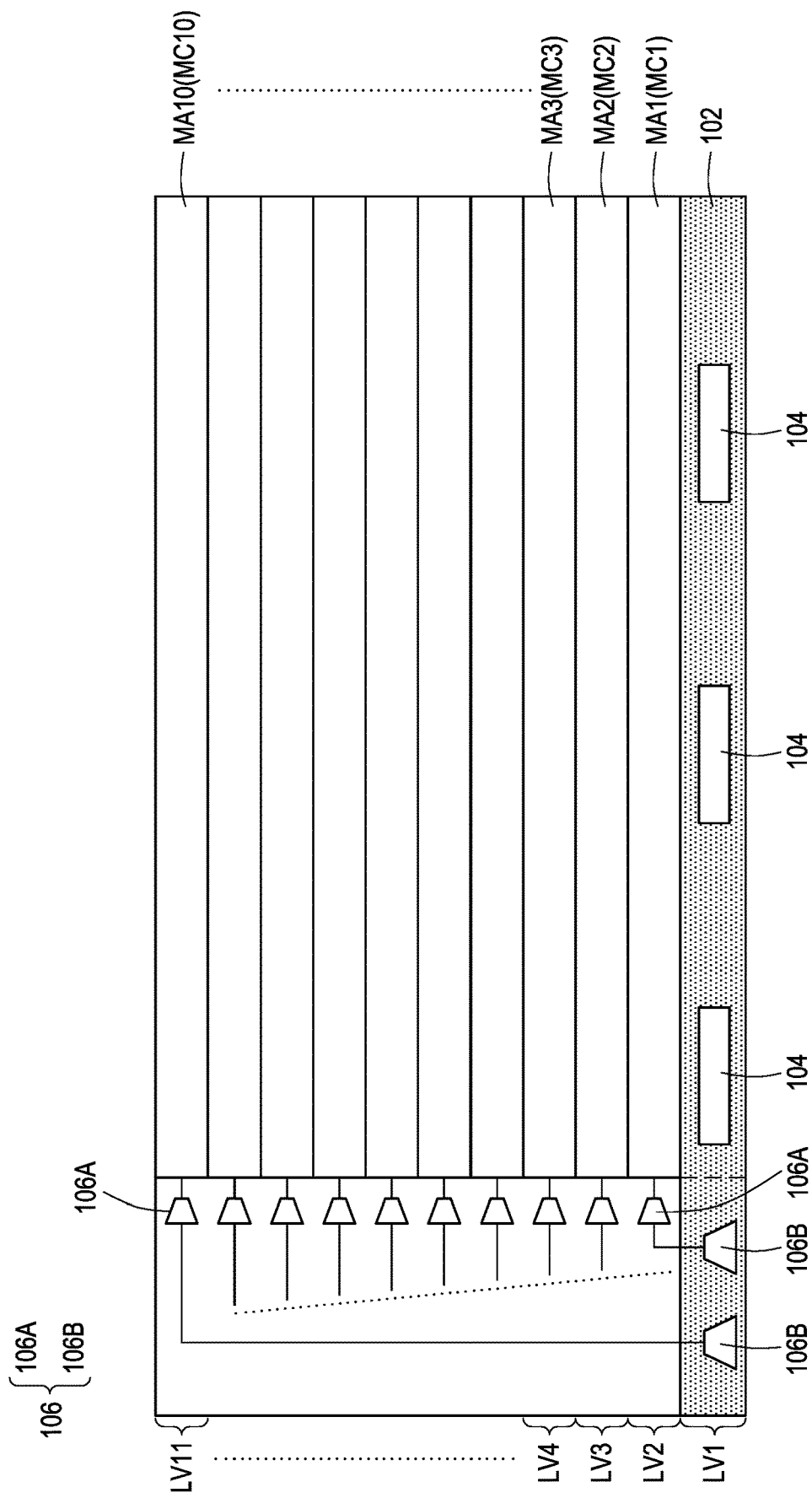
FIG. 1A and FIG. 1B are schematic sectional and top views of a semiconductor device in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
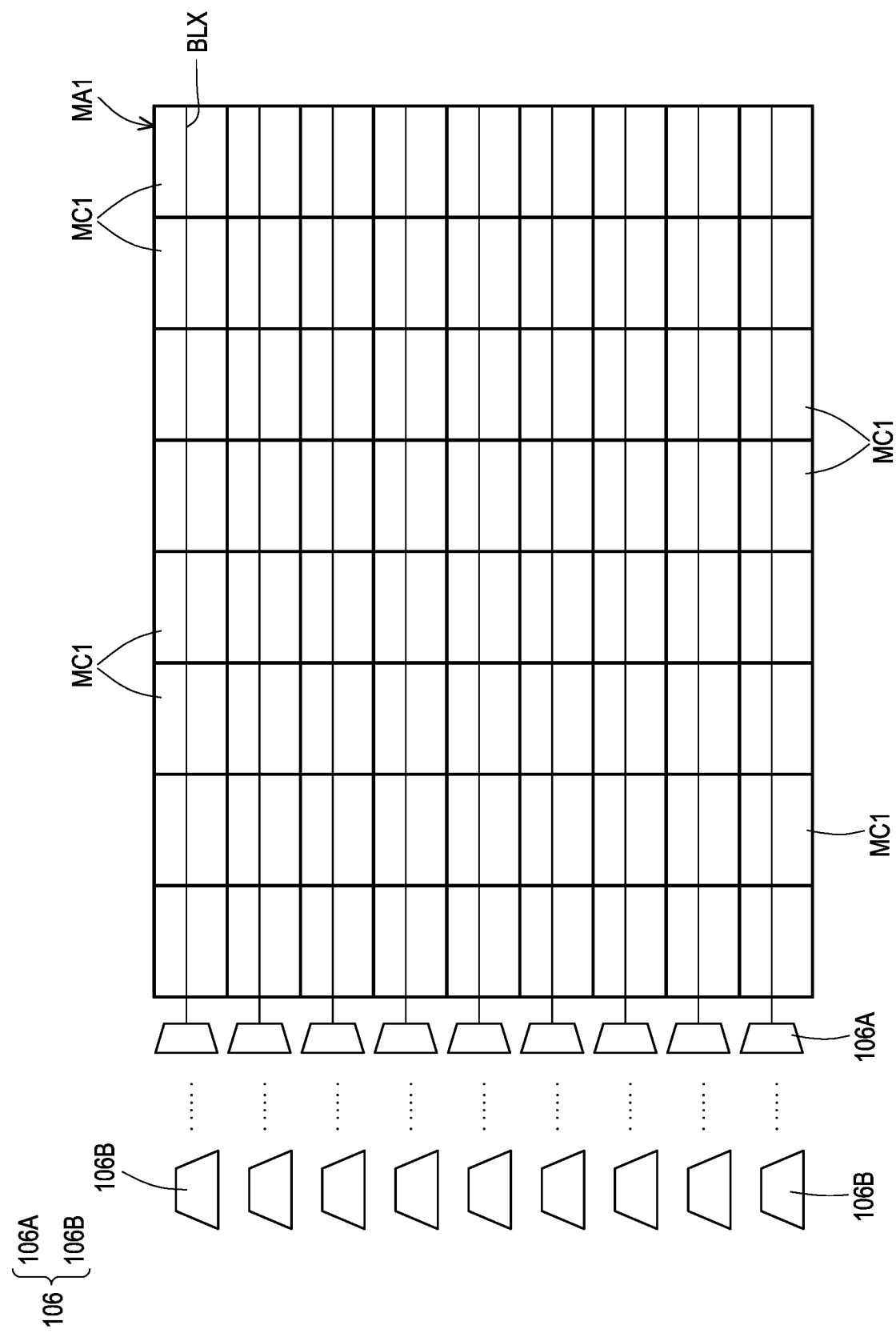

FIG. 1A and FIG. 1B are schematic sectional and top views of a semiconductor device in accordance with some embodiments of the present disclosure. Referring to FIG. 1A, a semiconductor device includes a semiconductor substrate 102. The semiconductor substrate 102 may be a semiconductor wafer, such as a silicon wafer, or the like. In some embodiments, ground level circuitry 104 are disposed at a ground level LV1 over the semiconductor substrate 102. The ground level circuitry 104 may include logic circuits, word line drivers, and the like. The ground level LV1 described herein may be a front-end-of-line (FEOL) structure of a semiconductor device (semiconductor chip).

In some embodiments, a plurality of stacked memory arrays (MA1~MA10) are disposed at an elevated level over the ground level circuitry 104. For example, a first memory array MA1 is disposed at a second level LV2 over the semiconductor substrate 102 on the ground level circuitry 104. A second memory array MA2 is disposed at a third level LV3 over the semiconductor substrate 102, above the second level LV2 and on the ground level circuitry 104. In a similar way, a plurality of memory arrays including a third memory array MA3 up till a tenth memory array MA10 are stacked up in sequence from the fourth level LV4 till the eleventh level LV11 over the semiconductor substrate 102.

As illustrated in FIG. 1A, each of the memory arrays (MA1~MA10) includes a plurality of memory cells (MC1~MC10). For example, the first memory array MA1 includes a plurality of first memory cells MC1, the second memory array MA2 includes a plurality of second memory cells MC2, and the third memory array MA3 includes a plurality of third memory cells MC3, and so forth. In the exemplary embodiment, the memory cells (MC1~MC10) are for example, dynamic random access memory (DRAM) type memory cells. However, the disclosure is not limited thereto, and other type of memory cells may be applied.

In some embodiments, a plurality of sense amplifier units 106 (sense amplifier circuits) is disposed on the semiconductor substrate 102. For example, each of the sense amplifier units 106 includes an amplifier circuit 106A and a main circuit 106B. The amplifying circuit 106A is disposed aside each of the memory arrays (MA1~MA10) at the elevated levels (LV2~LV11) above the ground level circuitry 104. In some embodiments, the amplifying circuit 106A may include transistor(s) used for amplifying signals (or voltage) received from the memory arrays (MA1~MA10) located at the respective levels. Furthermore, the main circuit 106B is disposed on the semiconductor substrate 102 at the ground level LV1 aside the ground level circuitry 104, wherein the main circuit 106B is electrically coupled to plurality of memory arrays (MA1~MA10) through the amplifying circuit 106A. In some embodiments, the main circuit 106B include transistor(s) used for performing read operation of the signals received from the memory arrays (MA1~MA10).

FIG. 1B is a top view of the first memory array MA1 shown in FIG. 1A. As illustrated in FIG. 1B, the first memory array MA1 includes a plurality of first memory cells MC1 arranged along the first direction X1 and the second direction X2. The second direction X2 being perpendicular to the first direction X1. In some embodiments, those first memory cells MC1 located in the same row (along the first direction X1) may share the same bit line BLX. For example, the bit line BLX are attached (electrically coupled) to the sense amplifier units 106 (sense amplifier circuits) at the edge of the first memory array MA1. In some embodiments, the data (electric charge) stored in a first memory cell MC1 may affect the voltage on the associated bit line BLX. As an example, when data "0" is stored in a first memory cell MC1, the voltage on the associated bit line BLX may be pulled down from a pre-charge voltage during a read operation. On the other hand, when data "1" is stored in a first memory cell MC1, the voltage on the associated bit line BLX may stay at the pre-charge voltage. In some embodiments, the amplifier circuit 106A amplifies the voltage difference corresponding to data "0" and data "1", whereby the main circuit 106B performs readout based on the voltage output by the amplifier circuit 106A.

Although FIG. 1B only illustrate a top view of the first memory array MA1 and its connection with the sense amplifier units 106, it is noted that the other memory arrays (MA2~MA10) located at different levels (LV3~LV11) may have similar configurations and connections. For example, sense amplifier units 106 (amplifying circuit 106A) may be electrically coupled to the memory arrays (MA2~MA10) through the respective bit lines BLX for performing amplification and read out functions.

Figure 2:
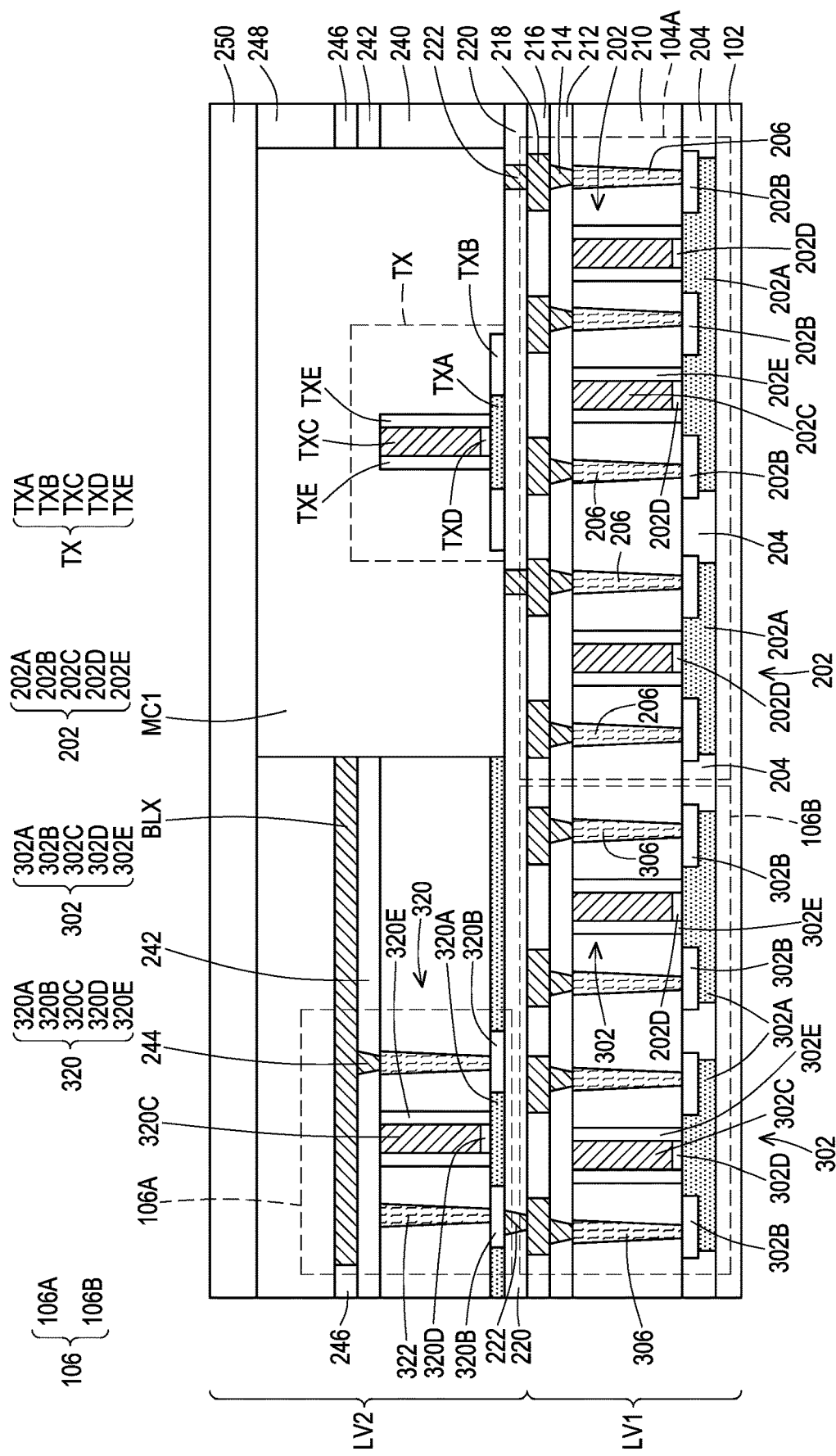
FIG. 2 is an enlarged sectional view of a portion of a semiconductor device in accordance with some embodiments of the present disclosure.

FIG. 2 is an enlarged sectional view of a portion of a semiconductor device in accordance with some embodiments of the present disclosure. For example, FIG. 2 is an enlarged sectional view of a portion of FIG. 1A showing the ground level circuitry 104 at the ground level LV1, the first memory cell MC1 at the second level LV2, and the sense amplifier unit 106 extending across the ground level LV1 and the second level LV2. In FIG. 2, the detailed components in the first memory cell MC1 is omitted for ease of illustration, and only one transistor TX of the first memory cell MC1 is shown.

As illustrated in FIG. 2, a logic circuit 104A (part of the ground level circuitry 104) is disposed at the ground level LV1 over the semiconductor substrate 102, while the first memory cells MC1 is disposed at the second level LV2 over the semiconductor substrate 102. In some embodiments, the logic circuit 104A includes a plurality of logic transistors 202. For example, the logic transistors 202 includes a logic active structure 202A, source/drain terminals 202B, a gate structure 202C, a gate dielectric layer 202D and sidewall spacers 202E. In some embodiments, the gate structure 202C is disposed at the ground level LV1 and cover and intersect with the logic active structures 202A. The gate dielectric layer 202D is lying between the gate structure 202C and the logic active structure 202A. In certain embodiments, the source/drain terminals 202B (source/drain regions) are located at opposite sides of the gate structure 202C and are embedded in the logic active structures 202A. Furthermore, a height of the source/drain terminals 202B (source/drain regions) is smaller than a height of the logic active structures 202A.

In some embodiments, source/drain contacts 206, conductive vias 214 and conductive patterns 218 are formed over the source/drain terminals 202B for out routing the transistors in the logic circuit 104A. In some embodiments, the gate structure 202C, gate dielectric layer 202D, sidewall spacers 202E and the source/drain contacts 206 are laterally surrounded by a dielectric layer 210. Similarly, the conductive vias 214 and the conductive patterns 218 are laterally surrounded by dielectric layers 212, 216. In certain embodiments, isolation structures 204 may be formed at the first level LV1 on the semiconductor substrate 102 separating the logic active structures 202A

As further illustrated in FIG. 2, an interlayer dielectric 220 is disposed on the dielectric layers 212, 216 covering the logic circuit 104A. Furthermore, the first memory cells MC1 are disposed on the interlayer dielectric 220 over the logic circuit 104A at the second level LV2 on the semiconductor substrate 102. In some embodiments, the first memory cells MC1 are electrically coupled to the logic circuit 104A through a plurality of conductive vias 222. For example, the conductive vias 222 are laterally surrounded by the interlayer dielectric 220, and electrically connects the first memory cells MC1 to the logic transistors 202.

In some embodiments, each of the first memory cells MC1 disposed on the interlayer dielectric 220 includes at least one transistor TX, and may include a storage capacitor (not shown). In some embodiments, the transistor TX includes an active structure TXA, source/drain terminals TXB, a gate structure TXC, a gate dielectric layer TXD and sidewall spacers TXE. In some embodiments, the active structure TXA disposed at the second level LV2 is a semiconductor pattern (e.g., silicon pattern) laterally surrounded by an insulating layer (not shown). The gate structure TXC covers and intersects with the active structures TXA. The gate dielectric layer TXD is lying between the gate structure TXC and the active structure TXA. In certain embodiments, the source/drain terminals TXB (source/drain regions) are located at opposite sides of the gate structure TXC and are embedded in the active structures TXA. In some embodiments, a height of the active structures TXA located at the second level LV2 is equal to or smaller than a height of the logic active structures 202A located at the ground level LV1. In certain embodiments, a height of the source/drain terminals TXB is substantially equal to the height of the active structures TXA.

Referring to FIG. 2, the semiconductor device may further include sense amplifier units 106, whereby each of the sense amplifier units 106 include an amplifying circuit 106A disposed on the second level LV2 and a main circuit 106B disposed on the ground level LV1. In some embodiments, the main circuit 106B is disposed on the semiconductor substrate 102 at the ground level LV1 aside the ground level circuitry 104 or aside the logic circuit 104A. For example, the main circuit 106B includes a plurality of sense amplifier transistors 302 located aside the logic circuit 104A.

In some embodiments, each of the sense amplifier transistors 302 includes an active structure 302A, source/drain terminals 302B, a gate line 302C, a gate dielectric layer 302D and sidewall spacers 302E. In some embodiments, the gate line 302C is disposed at the ground level LV1, and cover and intersect with the active structures 302A. The gate dielectric layer 302D is lying between the gate line 302C and the active structure 302A. In certain embodiments, the source/drain terminals 302B (source/drain regions) are located at opposite sides of the gate line 302C and are embedded in the active structures 302A. In some embodiments, a height of the active structures 302A of the sense amplifier transistors 302 is substantially equal to a height of the logic active structures 202A of the logic transistors 202 located at the ground level LV1. In certain embodiments, a height of the source/drain terminals 302B is smaller than a height of the active structures 302A. Furthermore, source/drain contacts 306, conductive vias 214 and conductive patterns 218 are formed over the source/drain terminals 302B for out routing the sense amplifier transistors 302. In some embodiments, the gate line 302C, gate dielectric layer 302D, sidewall spacers 302E and the source/drain contacts 306 are laterally surrounded by the dielectric layer 210.

As further illustrated in FIG. 2, the amplifying circuit 106A is disposed on the interlayer dielectric 220 over the main circuit 106B at the second level LV2 on the semiconductor substrate 102. In some embodiments, the amplifying circuit 106A is electrically coupled to the main circuit 106B through the conductive vias 222. Furthermore, the amplifying circuit 106A is electrically coupled to the first memory cells MC1 through conductive vias 244 and bit lines BLX. In other words, the main circuit 106B may be electrically coupled to the first memory cells MC1 through the amplifying circuit 106A.

In the exemplary embodiment, the amplifying circuit 106A includes one sense amplifier transistor 320 disposed on the interlayer dielectric 220. For example, the sense amplifier transistor 320 includes an active structure 320A, source/drain terminals 320B, a gate line 320C, a gate dielectric layer 320D and sidewall spacers 320E. In some embodiments, the gate line 320C is disposed at the second level LV2, and cover and intersect with the active structures 320A. The gate dielectric layer 320D is lying between the gate line 320C and the active structure 320A. In certain embodiments, the source/drain terminals 320B (source/drain regions) are located at opposite sides of the gate line 320C and are embedded in the active structures 320A. In some embodiments, a height of the active structures 320A of the sense amplifier transistor 320 is substantially equal to a height of the active structure TXA of the transistors TX of the first memory cells MC1. Furthermore, the height of the active structures 320A of the sense amplifier transistor 320 is equal to or smaller than the height of the active structures 302A of the sense amplifier transistors 302, and equal to or smaller than the height of the logic active structure 202A of the logic transistors 202. In certain embodiments, a height of the source/drain terminals 320B is substantially equal to the height of the active structures 320A. Furthermore, source/drain contacts 322 are formed over the source/drain terminals 320B for out routing the sense amplifier transistors 320. For example, the bit lines BLX are electrically coupled to the source/drain terminals 320B through the conductive vias 244 and the source/drain contacts 322.

In some embodiments, the gate line 320C, gate dielectric layer 320D, sidewall spacers 320E and the source/drain contacts 322 are laterally surrounded by the dielectric layer 240. Furthermore, the conductive via 244 and the bit lines BLX are laterally surrounded by the dielectric layers 242, 246, while the first memory cell MC1 are further surrounded by the dielectric layer 248. In some embodiments, an interlayer dielectric 250 is disposed on the semiconductor substrate 102 and covering the first memory cells MC1. For example, the interlayer dielectric 250 separates the first memory cells MC1 from the second memory cells MC2 (shown in FIG. 1A) located at the third level LV3.

In the above embodiments, when the transistors (202, 302) at the ground level LV1 are planar type field effect transistors (FETs), then their respective active structures may be a doped region in the semiconductor substrate 102. In some other embodiments where the transistors (202, 302) at the ground level LV1 are fin type FETs or gate-all-around (GAA) FETs, then their respective active structures may be a semiconductor fin structure or a stack of semiconductor nanosheets/rods formed at a surface of the semiconductor substrate 102. On the other hand, the transistors (TX, 320) at the second level LV2 may be planar type field effect transistors (FETs), and their respective active structures may be a semiconductor pattern. In some other embodiments where the transistors (TX, 320) at the second level LV2 are fin type FETs or gate-all-around (GAA) FETs, then their respective active structures may be a semiconductor fin structure or a stack of semiconductor nanosheets/rods formed at a surface of the interlayer dielectric 220.

Although the semiconductor device shown in FIG. 2 only illustrates the ground level LV1 and the second level LV2 components, it is noted that a plurality of stacked memory arrays (MA2~MA10) or stacked memory cells (MC2~MC10) may be further located above the first memory cells MC1 at the second level LV2. For example, in one embodiment, a plurality of second memory cells MC2 is further disposed on the interlayer dielectric 250 above the plurality of first memory cells MC1 (shown in FIG. 1A). Furthermore, a sense amplifier transistor 320 (not shown) may be disposed above the interlayer dielectric 250 aside the second memory cells MC2 at the third level LV3 on the semiconductor substrate 102. For example, the sense amplifier transistor 320 at the third level LV3 may be part of the amplifying circuit 106A, and is electrically coupled to the main circuit 106B located at the ground level LV1.

Figure 3B:
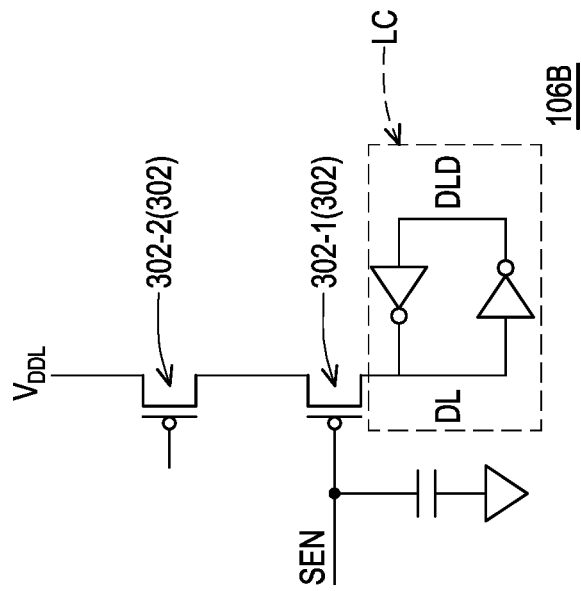
FIG. 3A and FIG. 3B are circuit diagrams of a sense amplifier circuit in a semiconductor device according to some embodiments of the present disclosure.
Figure 3A:
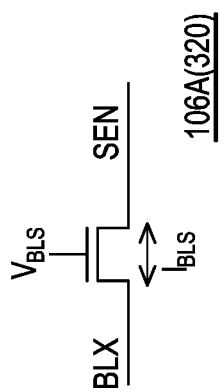

FIG. 3A is a circuit diagram of an amplifying circuit 106A in a sense amplifier unit 106, according to some embodiments of the present disclosure. FIG. 3B is a circuit diagram of a main circuit 106B coupled to the amplifying circuit 106A, according to some embodiments of the present disclosure.

Referring to FIG. 3A, in some embodiments, the amplifying circuit 106A is realized by a single sense amplifier transistor 320, which may be an N-type field effect transistor. One of the source/drain terminals of the sense amplifier transistor 320 is coupled to a bit line BLX, and functioned as an input of the amplifying circuit 106A. The other source/drain terminal of the sense amplifier transistor 320 may be functioned as an output terminal SEN of the amplifying circuit 106A, and is coupled to the main circuit 106B in the same sense amplifier unit 106. During a read operation, a gate voltage $V_{BLS}$ is provided to a gate terminal of the sense amplifier transistor 320, and may be controlled to ensure that the sense amplifier transistor 320 is operated in a subthreshold region. Accordingly, small difference between bit line voltages corresponding to data "0" and data "1" can result in significant changes of the on-current $I_{BLS}$ of the sense amplifier transistor 320. Therefore, the output terminal SEN can be charged/discharged to differentiable voltage levels.

Referring to FIG. 3A and FIG. 3B, the output terminal SEN of the amplifying circuit 106A may be coupled to an input terminal of the main circuit 106B. The voltage level at the terminal SEN may influence switching of a sense amplifier transistor 302 (referred as a transistor 302-1 hereinafter) with a gate terminal coupled to the terminal SEN. A source/drain terminal of the transistor 302-1 may be coupled to a voltage $V_{DDL}$ through another sense amplifier transistor 302 (referred as a transistor 302-2 hereinafter), while the other source/drain terminal of the transistor 302-1 may be coupled to a latch circuit LC. During a read operation, the transistor 302-2 is turned on, and switching of the transistor 302-1 is dependent on the voltage level of the terminal SEN. When the transistor 302-1 is turned on, the voltage $V_{DDL}$ can be provided to the latch circuit LC through the transistors 302-1, 302-2, and one of the complementary nodes DL, DLD of the latch circuit LC as an output terminal of the main circuit 106B (e.g., the node DL) may be charged. On the other hand, when the transistor 302-1 is kept in an off state, such node of the latch circuit LC (e.g., the node DL) may not be charged by the voltage $V_{DDL}$. Therefore, a voltage level at the output terminal of the main circuit 106B (e.g., the node DL) is controlled by the transistor 302-1, and switching of the transistor 302-1 is dependent on the voltage level at the terminal SEN, which reflects the data stored in the associated memory cell. In other words, the data stored in a memory cell can be initially amplified by the amplifying circuit 106A, and further amplified and output by the main circuit 106B.

FIG. 4A to FIG. 4E are cross-sectional views illustrating structures at various stages of manufacturing a transistor at an elevated level over the semiconductor substrate in accordance with some embodiments of the present disclosure. For example, a method of forming the sense amplifier transistor 320 located at the second level LV2 over the semiconductor substrate 102 will be described.

Referring to FIG. 4A, a semiconductor pattern SP1 may be formed on the interlayer dielectric 220. In some embodiments, a method for forming the semiconductor pattern SP1 includes globally depositing a semiconductor layer, and patterning the semiconductor layer to form the semiconductor pattern SP1 by a lithography process and an etching process. The semiconductor pattern SP1 is formed of a semiconductor material. For instance, the semiconductor material is amorphous silicon.

Referring to FIG. 4B, another interlayer dielectric 224 may be formed to laterally surround the semiconductor pattern SP1. In some embodiments, a method for forming the interlayer dielectric 224 includes forming a dielectric layer globally covering the semiconductor pattern SP1 and the underlying interlayer dielectric 220, and performing a planarization process to remove portions of the dielectric layer above the semiconductor pattern SP1. Remained portions of the dielectric layer form the interlayer dielectric 224. As examples, the planarization process may include a polishing process, an etching process or a combination thereof.

Referring to FIG. 4C, an annealing process is performed on the semiconductor pattern SP1, such that the semiconductor pattern SP1 turns into the active structures 320A for the sense amplifier transistor 320 described above. In those embodiments where the semiconductor pattern SP1 is formed of amorphous silicon, the amorphous silicon may be crystallized to form polycrystalline silicon or crystalline silicon during the annealing process. Accordingly, in these embodiments, the formed active structures 320A include polycrystalline silicon or crystalline silicon. In some embodiments, the annealing process is a laser annealing process or thermal annealing process, and a process temperature of the annealing process may be about 400° C. As a result of such annealing process, a field effect mobility and/or other characteristics of the transistors can be significantly improved.

Referring to FIG. 4D, a gate line 320C, a gate dielectric layer 320D and sidewall spacers 320E are respectively formed. For example, similar to that described in FIG. 3, the gate line 320C is disposed over the active structure 320A; the gate dielectric layer 320D is lying between the gate line 320C and the active structure 320A; and the sidewalls spacers 320E are covering the gate line 320C and the gate dielectric layer 320E.

In some embodiments, the gate line 320C is formed of polycrystalline silicon. In these embodiments, a method for forming the gate structure may include sequentially forming a dielectric layer and a polycrystalline silicon layer on the active structure 320A, and patterning the dielectric layer and the polycrystalline silicon layer to form the gate dielectric layer 320D the gate line 320C respectively. Subsequently, the sidewall spacer 320E may be formed on sidewalls of the gate line 320C and the gate dielectric layer 320D by a deposition process and an etching back process. In alternative embodiments where the gate line 320C is formed of a metallic material, a replacement gate process may be used for forming the gate structure. Further, although not shown, a pair of lightly doped regions may be optionally formed in the active structure 320A at opposite sides of the gate line 320C before formation of the sidewall spacers 320E.

Referring to FIG. 4E, source/drain terminals 320B are formed in the active structures 320A at opposite sides of the gate line 320C. In those embodiments where the source/drain terminals 320B are doped regions in the active structure 320A, a method for forming the source/drain terminals 320B may include an ion implantation process and an annealing process. In alternative embodiments, a method for forming the source/drain terminals 320B includes forming openings in the active structure 320A, and filling the source/drain terminals 320B into these openings by, for example, an epitaxial process.

Up to here, the sense amplifier transistor 320 located at the second level LV2 of the semiconductor substrate 102 are formed. As compared with transistors (302, 202) formed using active structures on the semiconductor substrate 102 (or active structures being part of the semiconductor wafer), the transistors in the second level LV2 uses the active structures formed from a deposited semiconductor layer. Although, the transistors located at the second level LV2 is used as an example for description, it is noted that the transistors located at the elevated levels (e.g. third level LX3, fourth level LX3 etc.) in the back-end-of-line (BEOL) process may be formed in a similar manner. In other words, the process described in FIG. 4A to FIG. 4E is a BEOL compatible process.

Figure 5A:
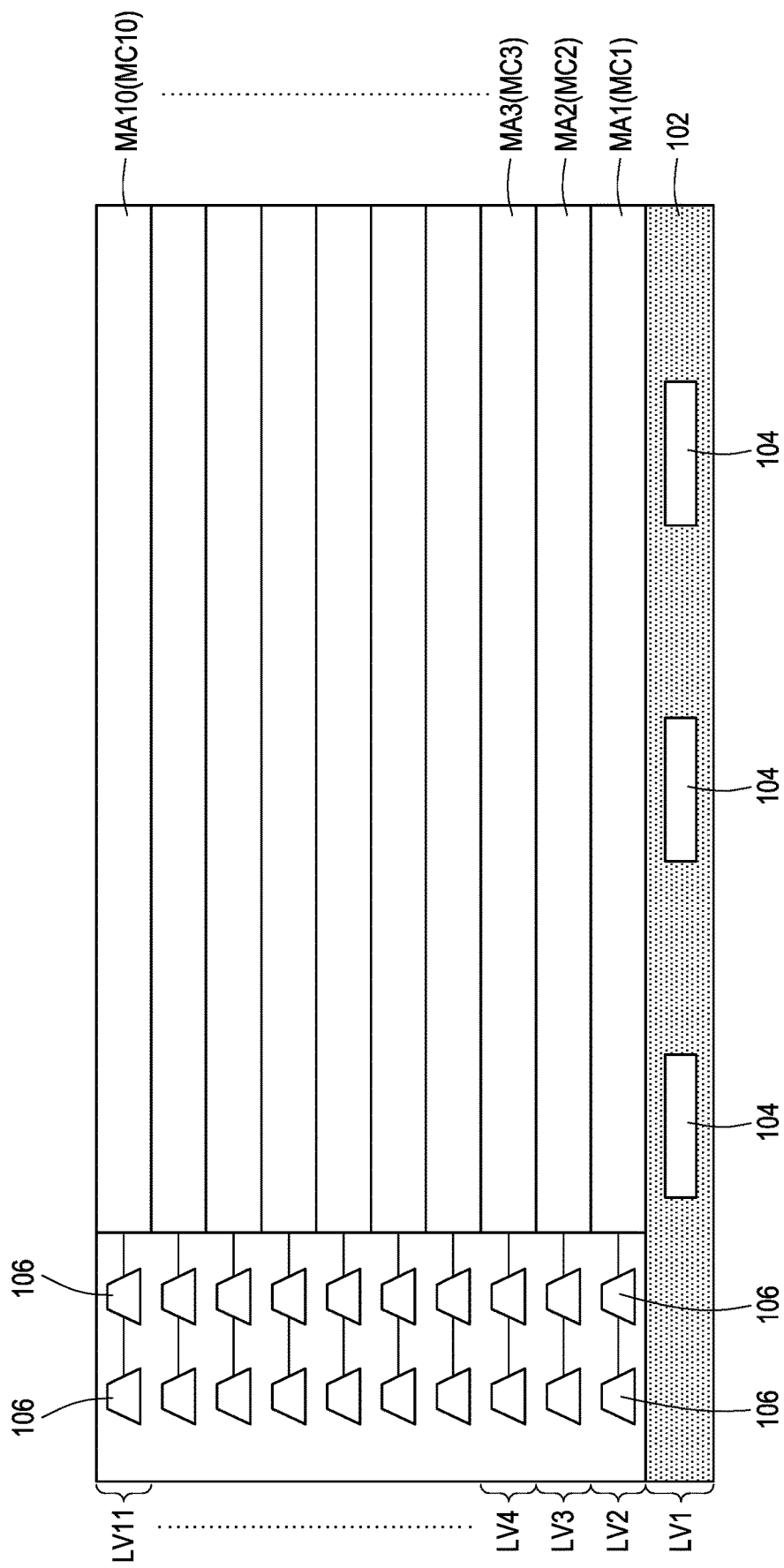
FIG. 5A and FIG. 5B are schematic sectional and top views of a semiconductor device in accordance with some other embodiments of the present disclosure.
Figure 5B:
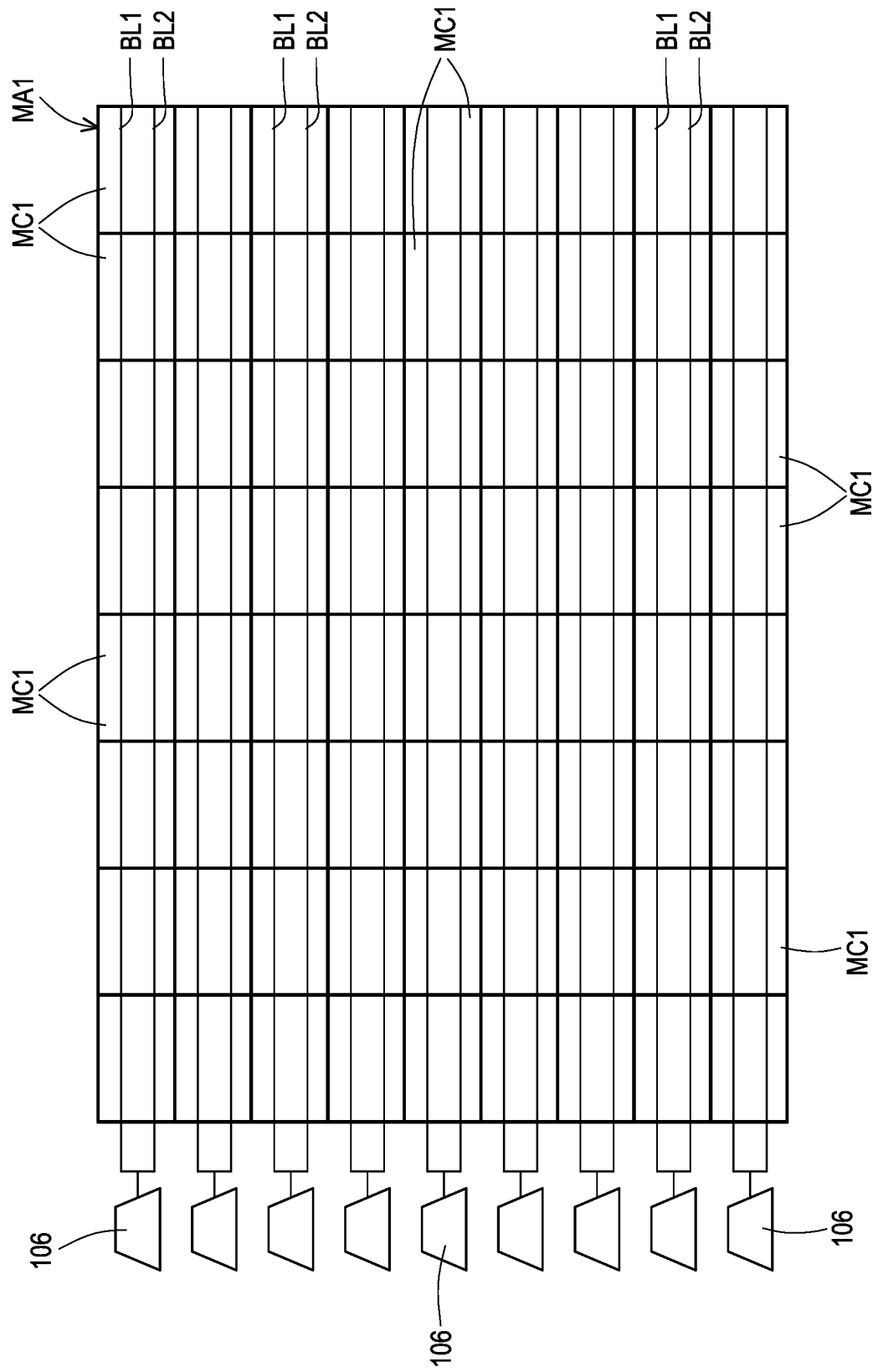

FIG. 5A and FIG. 5B are schematic sectional and top views of a semiconductor device in accordance with some other embodiments of the present disclosure. The semiconductor device illustrated in FIG. 5A and FIG. 5B is similar to the semiconductor device illustrated in FIG. 1A and FIG. 1B. Therefore, the same reference numerals are used to refer to the same or liked parts, and its detailed description will be omitted herein.

In the previous embodiment, the amplifying circuit 106A is located at elevated levels (e.g. second level LV2 or above), while the main circuit 106B is located at the ground level LV1. However, the disclosure is not limited thereto. As illustrated in FIG. 5A and FIG. 5B, in some embodiments, the entire sense amplifier units 106 are located at the elevated levels. In addition, the amplification and readout functions are integrated as one circuit in each of the sense amplifier units 106. As an example, each memory array (MA1~MA10) is electrically coupled to the sense amplifier units 106 located at the same level. As shown in FIG. 5B, illustrating the memory array MA1 at the second level LV2, the first memory cells MC1 located in the same row may be electrically coupled to the sense amplifier unit 106 at the same level using two complementary bit lines BL1, BL2.

In the exemplary embodiment, the bit lines BL1, BL2 are attached (electrically coupled) to the sense amplifier units 106 (sense amplifier circuits) at the edge of the first memory array MA1. In some embodiments, the sense amplifier unit 106 is configured to compare voltages on the associated bit lines BL1, BL2, and output a signal indicating the data stored in a selected first memory cell MC1 during a read operation. In such embodiment, the memory cells (MC1~MC10) in the memory arrays (MA1~MA10) are for example, static random access memory (SRAM) type memory cells.

Figure 6:
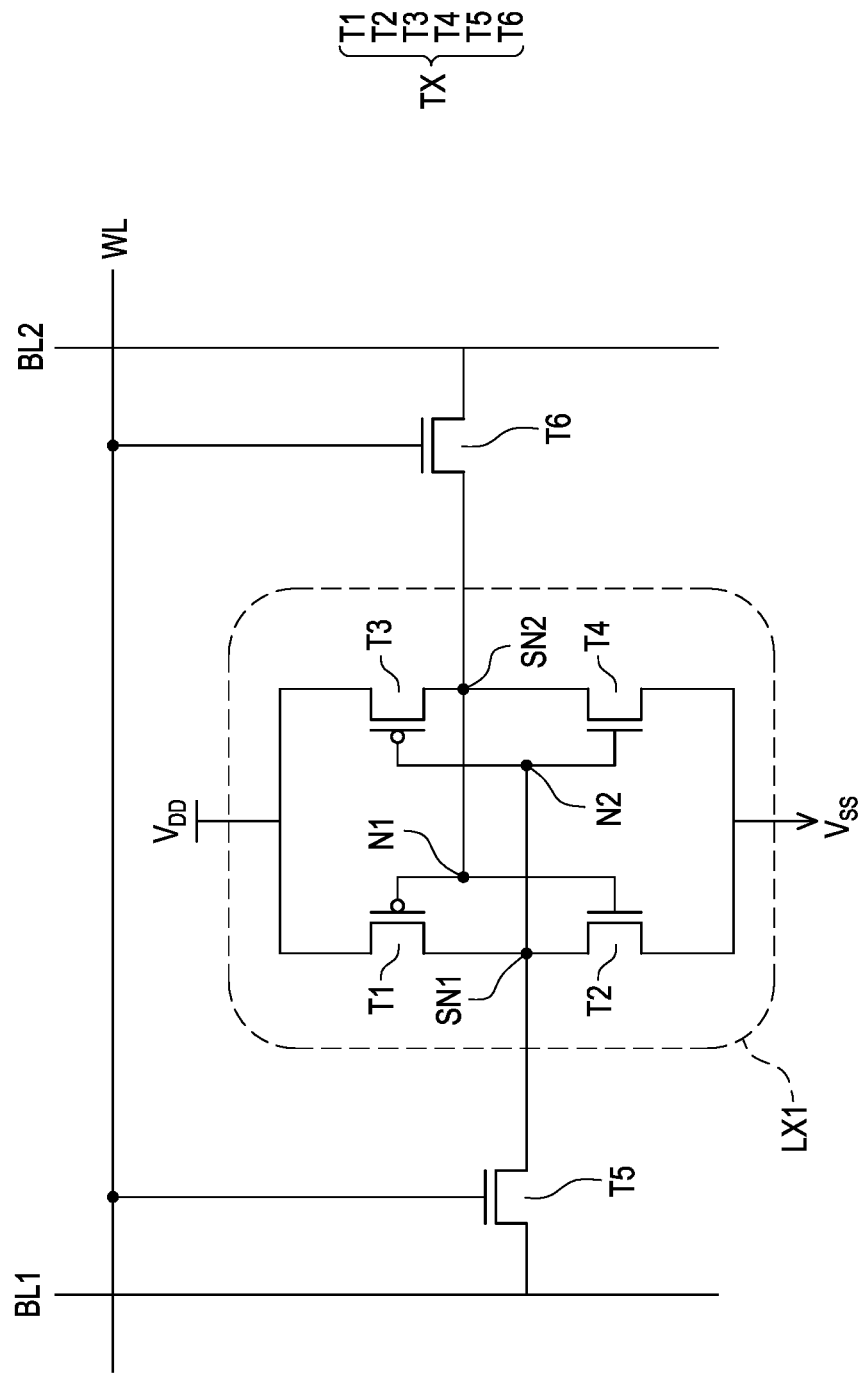
FIG. 6 is a circuit diagram of a memory cell in a semiconductor device according to some embodiments of the present disclosure.

FIG. 6 is a circuit diagram of a memory cell in a semiconductor device according to some embodiments of the present disclosure. The circuit diagram may correspond to each of the memory cells (MC1~MC10) located in the memory arrays (MA1~MA10) shown in FIG. 5A and FIG. 5B. In some embodiments, the memory cells (MC1~MC10) are SRAM memory cells including the transistors TX (including T1~T6).

As illustrated in FIG. 6, each of the memory cells (MC1~MC10) includes a latch circuit LX1. The latch circuit LX1 is configured to retain stored data without being periodically refreshed. In some embodiments, the latch circuit LX1 includes two inverters. A first inverter may include a pull up transistor T1 and a pull down transistor T2. The pull up transistor T1 may be a P-type field effect transistor (PFET), while the pull down transistor T2 may be an N-type field effect transistor (NFET). The pull up transistor T1 and the pull down transistor T2 share a common source/drain terminal, and such common source/drain terminal may be referred as a storage node SN1 of the memory cell (MC1~MC10). In addition, the other source/drain terminal of the pull up transistor T1 is coupled to a working voltage $V_{DD}$. On the other hand, the other source/drain terminal of the pull down transistor T2 is coupled to a reference voltage $V_{SS}$, such as a ground voltage. Furthermore, gate terminals of the pull up transistor T1 and the pull down transistor T2 are connected with each other. A node N1 coupled to the gate terminals of the pull up transistor T1 and the pull down transistor T2 may be an input terminal of the first inverter, and the storage node SN1 may be an output terminal of the first inverter.

Similarly, a second inverter in the latch circuit LX1 may include a pull up transistor T3 and a pull down transistor T4. The pull up transistor T3 may be a PFET, while the pull down transistor T4 may be an NFET. The pull up transistor T3 and the pull down transistor T4 share a common source/drain terminal, which may be referred as a storage node SN2 of the memory cell (MC1~MC10). The other source/drain terminal of the pull up transistor T3 is coupled to the working voltage $V_{DD}$, while the other source/drain terminal of the pull down transistor T4 is coupled to the reference voltage $V_{SS}$. In addition, gate terminals of the pull up transistor T3 and the pull down transistor T4 are connected with each other. A node N2 coupled to the gate terminals of the pull up transistor T3 and the pull down transistor T4 may be an input terminal of the second inverter, while the storage node SN2 may be an output terminal of the second inverter.

The node N1 as the input terminal of the first inverter is coupled to the storage node SN2 as the output terminal of the second inverter, and the node N2 as the input terminal of the second inverter is coupled to the storage node SN1 as the output terminal of the first inverter. In other words, the first and second inverters of the latch circuit LX1 are cross-coupled. As a result, the storage nodes SN1, SN2 are ensured to store complementary logic data. For instance, when a logic data "0" is stored at the storage node SN1, the P-type pull up transistor T3 may be turned on as its gate terminal is coupled to the storage node SN1, and the storage node SN2 as a source/drain terminal of the pull up transistor T3 is pulled up by the working voltage $V_{DD}$ coupled to the other source/drain terminal of the pull up transistor T3. Therefore, a logic data "1" complementary to the logic data "0" is stored at the storage node SN2.

On the other hand, the N-type pull down transistor T4 is kept in an off state as its gate terminal is also coupled to the storage node SN1 holding at the logic data "0", thus the storage node SN2 as a source/drain terminal of the pull down transistor T4 would not be pulled down by the reference voltage $V_{SS}$ coupled to the other source/drain terminal of the pull down transistor T4. In addition, the N-type pull down transistor T2 is turned on as its gate terminal is coupled to the storage node SN2 holding at the logic data "1", and the storage node SN1 as a source/drain terminal of the pull down transistor T2 is kept discharged by the reference voltage $V_{ss}$ coupled to the other source/drain terminal of the pull down transistor T2. In addition, the P-type pull up transistor T1 is kept in an off state as its gate terminal is also coupled to the storage node SN2 holding at the logic data "1", thus the storage node SN1 as a source/drain terminal of the pull up transistor T1 would not be pulled up by the working voltage $V_{DD}$ coupled to the other source/drain terminal of the pull up transistor T1. Therefore, the logic data "0" can be retained at the storage node SN1.

Moreover, the memory cell (MC1~MC10) may further include an access transistor T5. A gate terminal of the access transistor T5 is connected to a word line WL. In addition, a source/drain terminal of the access transistor T5 is coupled to the storage node SN1, while the other source/drain terminal of the access transistor T5 is connected to a bit line BL1. When the access transistor T5 is turned on, the bit line BL1 can charge/discharge the storage node SN1, or vice versa. Accordingly, logic data can be programmed to the storage node SN1, or read out from the storage node SN1. On the other hand, when the access transistor T5 is in an off state, the storage node SN1 is decoupled from the bit line BL1, and logic data cannot be written to or read out from the storage node SN1. In other words, the access transistor T5 may control access of the storage node SN1.

Similarly, access of the storage node SN2 is controlled by an access transistor T6. The word line WL for controlling switching of the access transistor T5 may also connect to a gate terminal of the access transistor T6. In this way, the access transistors T5, T6 may be switched simultaneously. In addition, a source/drain terminal of the access transistor T6 is coupled to the storage node SN2, while the other source/drain terminal of the access transistor T5 is connected to a bit line BL2. When the access transistor T6 is turned on, the bit line BL2 can charge/discharge the storage node SN2, or vice versa. Accordingly, logic data can be programmed to the storage node SN2, or read out from the storage node SN2. On the other hand, when the access transistor T6 is in an off state, the storage node SN2 is decoupled from the bit line BL2, and logic data cannot be written to or read out from the storage node SN2. During a write operation, the bit lines BL1, BL2 may receive complementary logic data, in order to overwrite the logic data previously stored at the storage nodes SN1, SN2. In addition, during a read operation using the sense amplifier unit 106, both of the bit lines BL1, BL2 are pre-charged, and one of them is slightly pulled down by the corresponding storage node. By comparing voltage difference of the bit lines BL1, BL2, the logic data stored at the storage nodes SN1, SN2 can be read out using the sense amplifier unit 106.

Figure 7:
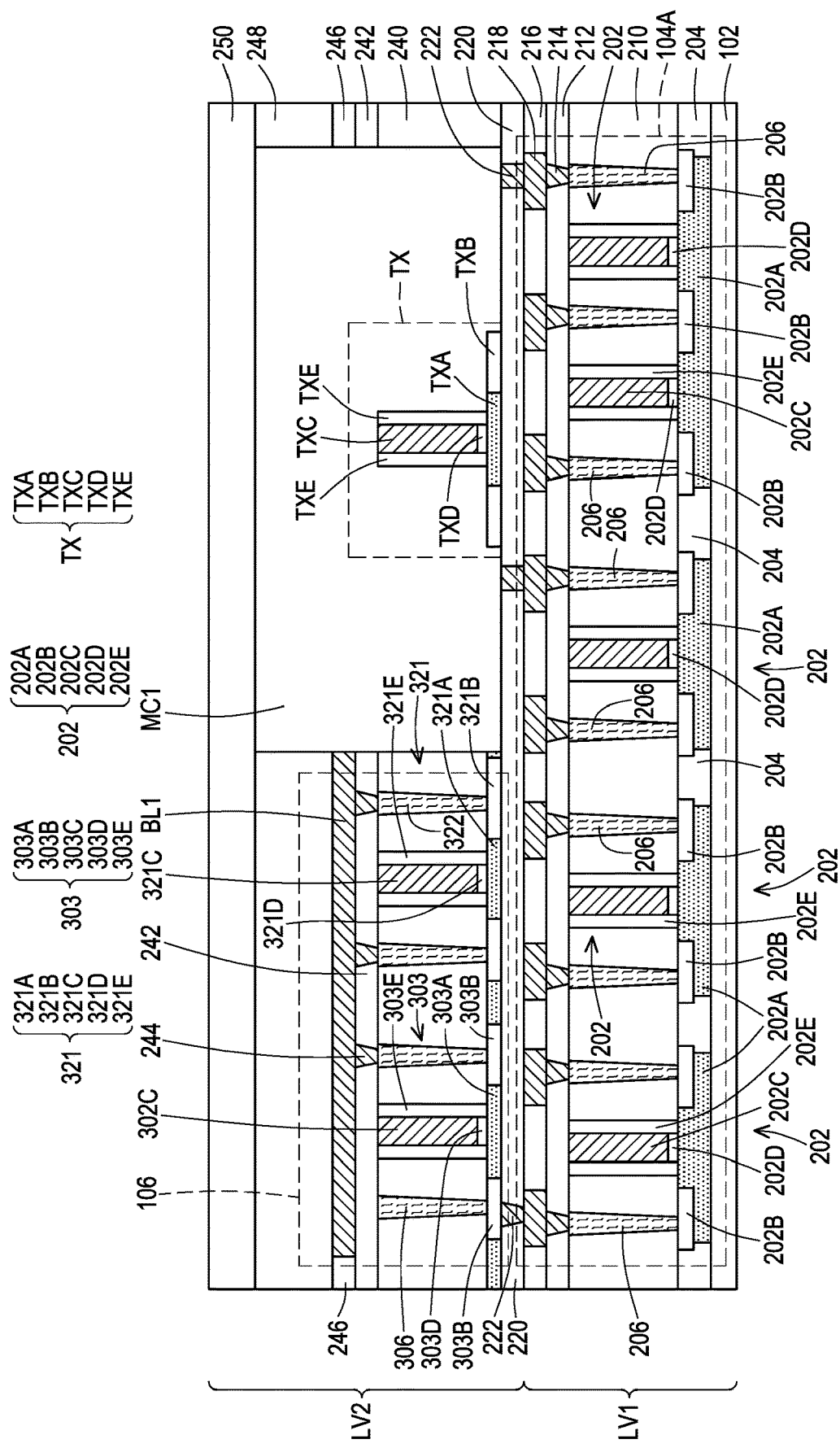
FIG. 7 is an enlarged sectional view of a portion of a semiconductor device in accordance with some other embodiments of the present disclosure.

FIG. 7 is an enlarged sectional view of a portion of a semiconductor device in accordance with some other embodiments of the present disclosure. For example, FIG. 7 is an enlarged sectional view of a portion of FIG. 5A showing the ground level circuitry 104 at the ground level LV1, the first memory cell MC1 and the sense amplifier unit 106 at the second level LV2. The semiconductor device illustrated in FIG. 7 is similar to the semiconductor device illustrated in FIG. 2. Therefore, the same reference numerals are used to refer to the same or liked parts, and its detailed description will be omitted herein.

As illustrated in the embodiment of FIG. 7, the logic circuit 104A (part of the ground level circuitry 104) is disposed at the ground level LV1 over the semiconductor substrate 102, while the first memory cells MC1 and the sense amplifier unit 106 are disposed at the second level LV2 over the semiconductor substrate 102. For example, the first memory cells MC1 and the sense amplifier unit 106 are located at the second level LV2 and overlapped with the transistors 202 of the logic circuit 104A. In some embodiments, the sense amplifier unit 106 includes sense amplifier transistors 303, 321 for performing amplification and read out. The sense amplifier transistors 303, 321 are structurally similar to the sense amplifier transistors 302, 320 described in FIG. 2, thus its details will not be repeated herein. For example, the sense amplifier transistors 303, 321 respectively includes active structures 303A, 321A, source/drain terminals 303B, 321B, gate lines 303C, 321C, gate dielectric layers 303D, 321D and sidewall spacers 303E, 321E.

In the exemplary embodiment, the sense amplifier transistors 303, 321 are located at the second level LV2, wherein heights of the active structures 303A, 321A of the sense amplifier transistors 303, 321 are equal to or smaller than a height of the logic active structures 202A located at the ground level LV1. Furthermore, the heights of the active structures 303A, 321A of the sense amplifier transistors 303, 321 are substantially equal to the height of the active structures TXA of the first memory cells MC1 located at the second level LV2. In certain embodiments, the first memory cells MC1 further include bit lines BL1, BL2 (only BL1 is shown) that are electrically coupled to source/drain regions 303B, 321B of the sense amplifier transistors 303, 321 through the conductive vias 244.

Figure 8A:
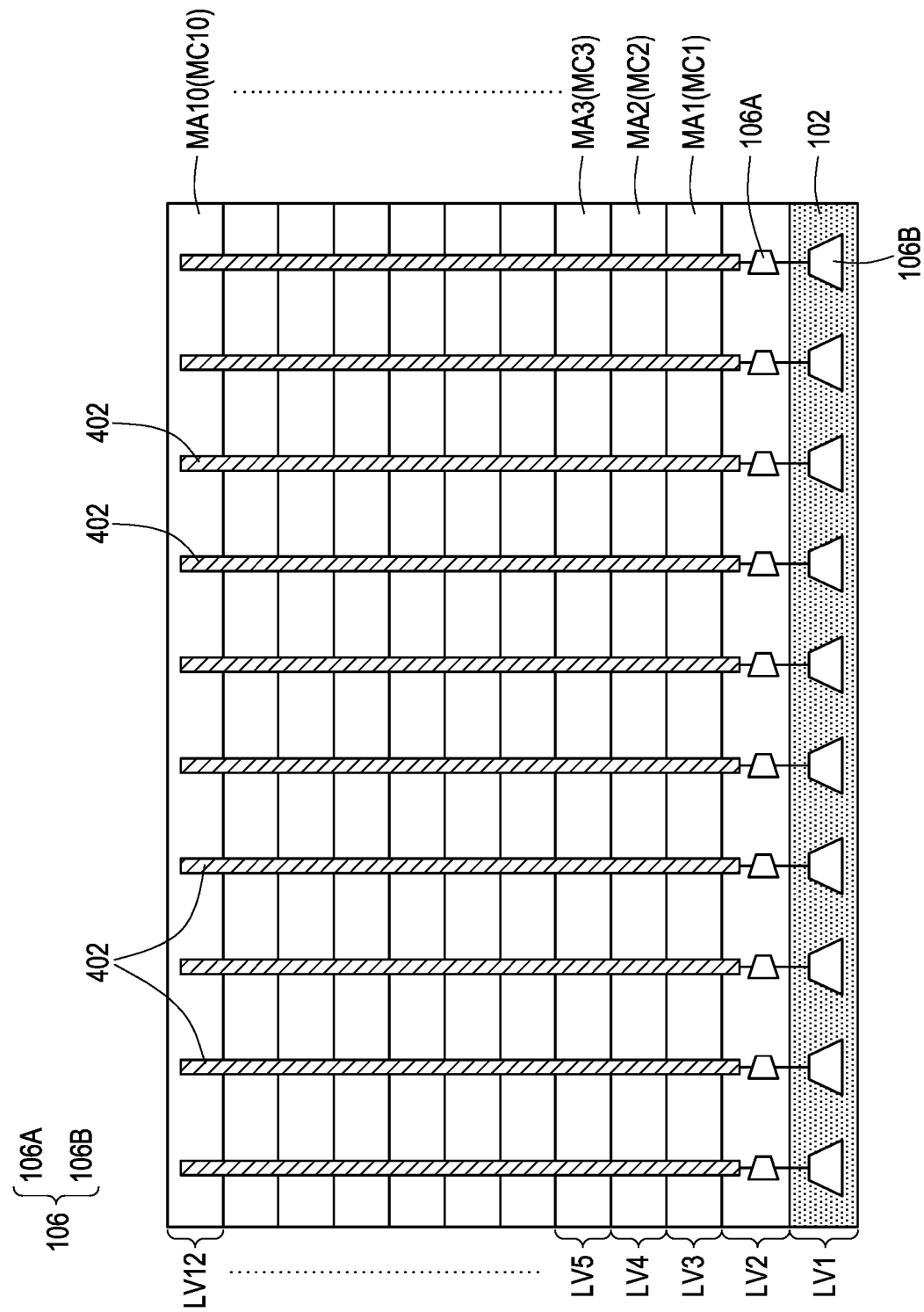
FIG. 8A is a schematic sectional view of a semiconductor device in accordance with some other embodiments of the present disclosure.

FIG. 8A is a schematic sectional view of a semiconductor device in accordance with some other embodiments of the present disclosure. The semiconductor device illustrated in FIG. 8A is similar to the semiconductor device illustrated in FIG. 1A and FIG. 1B. Therefore, the same reference numerals are used to refer to the same or liked parts, and its detailed description will be omitted herein.

As illustrated in FIG. 8A, in some embodiments, a plurality of sense amplifier units 106 is disposed at the first level LV1 and the second level LV2 on the semiconductor substrate 102. For example, the main circuit 106B is disposed at the first level LV1 on the semiconductor substrate 102 aside the ground level circuitry 104 (not shown). Furthermore, the amplifier circuit 106A is disposed above the main circuit 106B, and located at the second level LV2 on the semiconductor substrate 102. For example, the main circuit 106B is electrically coupled to the stacked memory arrays (MA1~MA10) through the amplifier circuit 106A. The memory cells (MC1~MC10) are for example, flash type memory cells.

In the exemplary embodiment, the stacked memory arrays (MA1~MA10) are disposed at an elevated level over the ground level circuitry 104 (not shown). For example, a first memory array MA1 is disposed at a third level LV3 over the semiconductor substrate 102 over the ground level circuitry 104 and on the sense amplifier units 106. A second memory array MA2 is disposed at a fourth level LV4 over the semiconductor substrate 102, above the third level LV3 and over the ground level circuitry 104. In a similar way, a plurality of memory arrays including a third memory array MA3 up till a tenth memory array MA10 are stacked up in sequence from the fifth level LV5 till the twelfth level LV12 over the semiconductor substrate 102.

In some embodiments, the semiconductor device further includes a plurality of through vias 402 electrically coupling bit lines BLX (not shown) of the plurality of stacked memory arrays (MA1~MA10) to the amplifying circuit 106A of each sense amplifier units 106. For example, the through vias 402 extends from the twelfth level LV12 to the second level LV2 and are electrically connecting the bit lines BLX of the memory cells (MC1~MC10) located in the same vertical column to the amplifying circuit 106A located at the second level LV2.

Figure 8B:
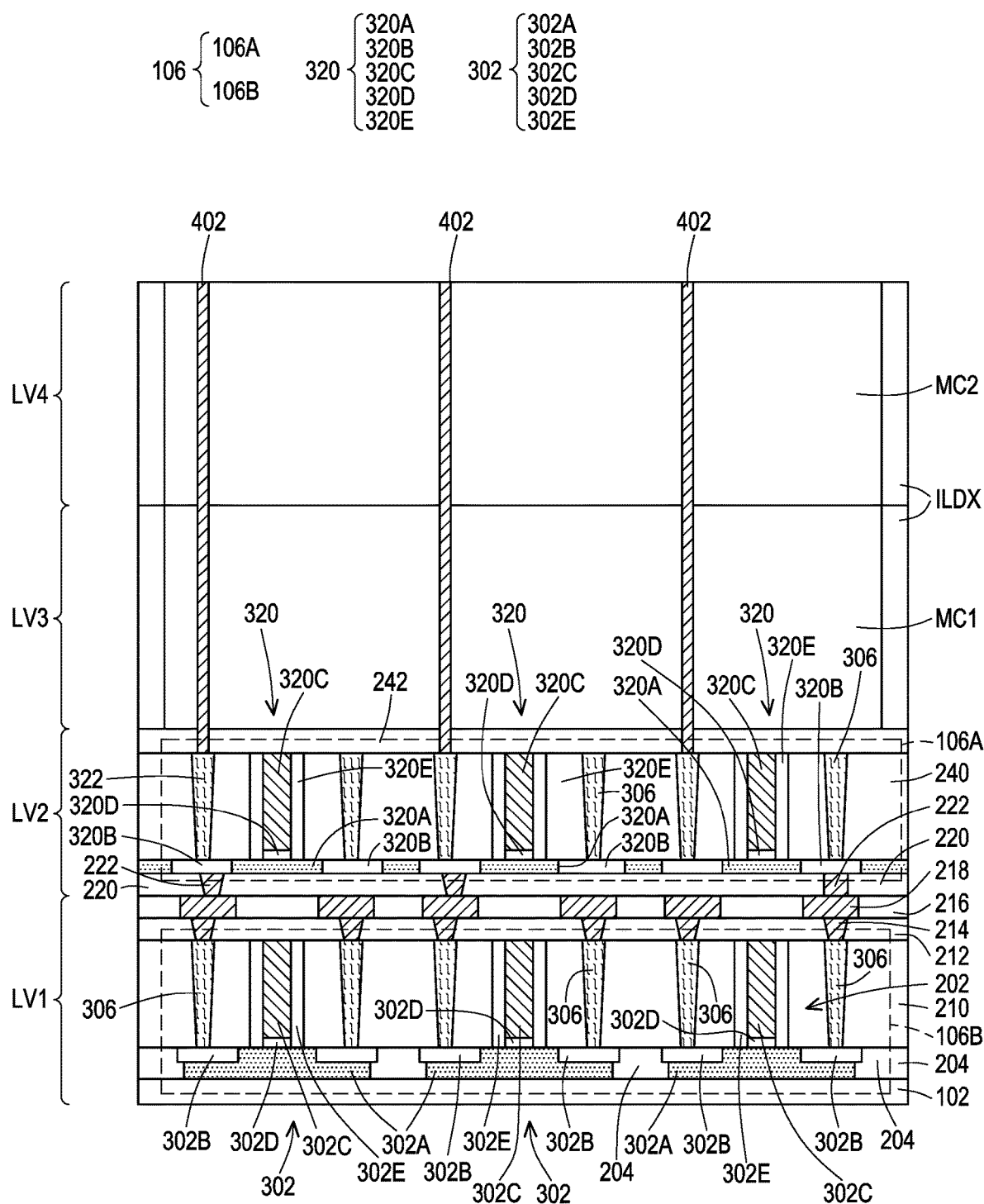
FIG. 8B is an enlarged sectional view of a portion of the semiconductor device shown in FIG. 8A.

FIG. 8B is an enlarged sectional view of a portion of the semiconductor device shown in FIG. 8A. As illustrated in FIG. 8B, the main circuits 106B are disposed at the first level LV1 on the semiconductor substrate 102 aside the ground level circuitry 104 (not shown). For example, each of the main circuits 106B includes a plurality of sense amplifier transistors 302 for performing readout operation. Furthermore, the amplifier circuits 106A are disposed above the main circuit 106B, and located at the second level LV2 on the semiconductor substrate 102. For example, each of the amplifier circuits 106A includes a sense amplifier transistor 320 that is electrically coupled to the sense amplifier transistors 302. In certain embodiments, the source/drain terminals 320B of the sense amplifier transistor 320 at the second level LV2 is electrically coupled to the source/drain terminals 302B of the sense amplifier transistor 302 at the first level LV1 through the conductive vias 214, 222, conductive patterns 218 and source/drain contacts 306.

As further illustrated in FIG. 8B, the first memory cells MC1 are located at the third level LV3 above the amplifier circuits 106A, while the second memory cells MC2 are located at the fourth level LV4 above the first memory cells MC1. The first memory cells MC1 and the second memory cells MC2 may be surrounded by interlayer dielectrics ILDX. In some embodiments, an interlayer dielectric (not shown) is located in between the first memory cells MC1 and the second memory cells MC2. In some embodiments, the first memory cells MC1 and the second memory cells MC2 are overlapped with the sense amplifier units 106 (sense amplifier circuits), and are overlapped with the ground level circuitry 104 (such as the logic circuit 104A). In some embodiments, the through vias 402 extends through the first memory cells MC1 and the second memory cells MC2, and electrically connect the bit lines BLX of the memory cells (MC1, MC2) to the sense amplifier transistor 320.

Figure 9A:
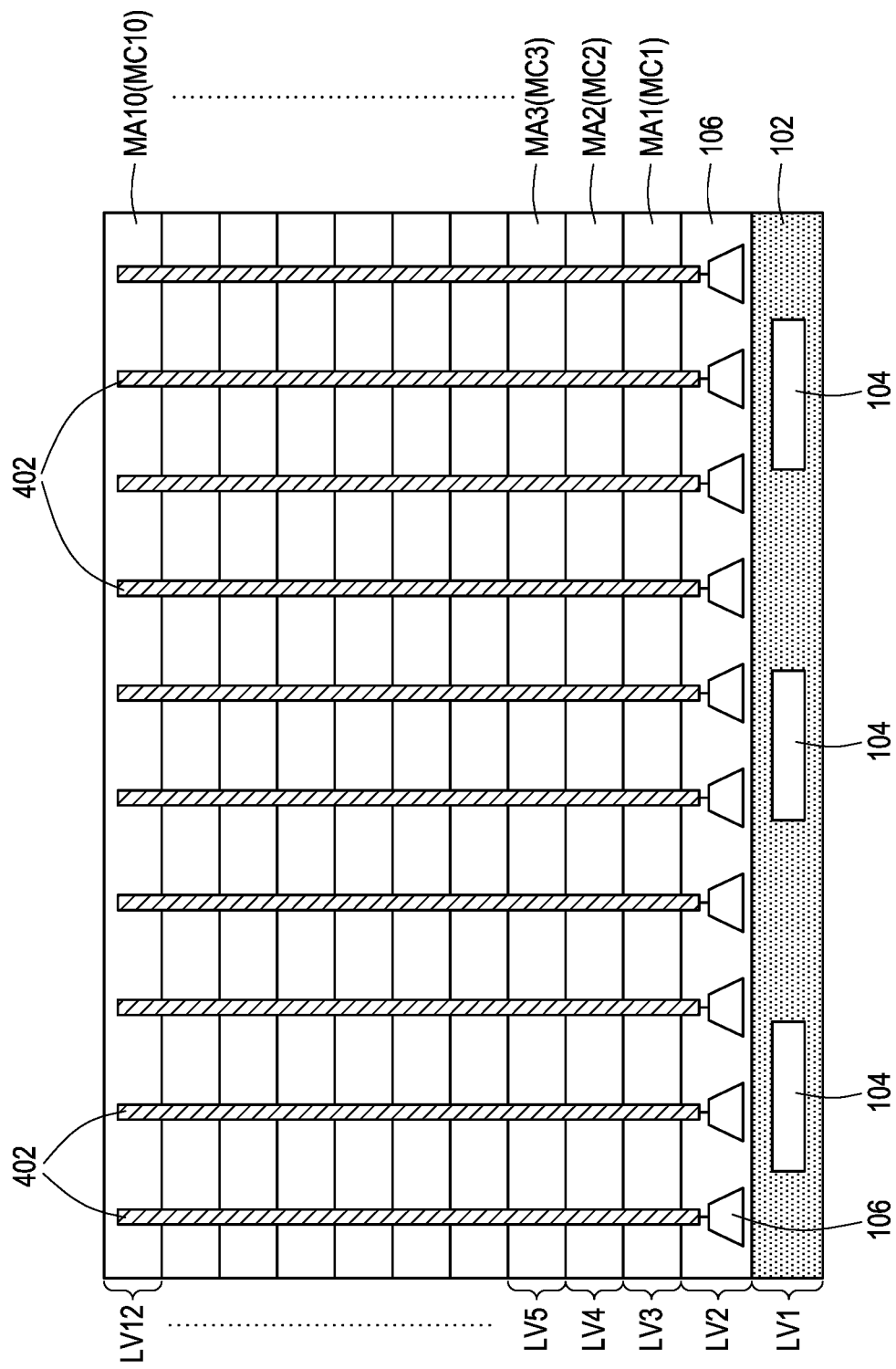
FIG. 9A is a schematic sectional view of a semiconductor device in accordance with some other embodiments of the present disclosure.

FIG. 9A is a schematic sectional view of a semiconductor device in accordance with some other embodiments of the present disclosure. The semiconductor device illustrated in FIG. 9A is similar to the semiconductor device illustrated in FIG. 8A. Therefore, the same reference numerals are used to refer to the same or liked parts, and its detailed description will be omitted herein.

As illustrated in FIG. 9A, in some embodiments, a plurality of sense amplifier units 106 is disposed at the second level LV2 on the semiconductor substrate 102, in between the stacked memory arrays (MA1~MA10) and the ground level circuitry 104. For example, the ground level circuitry 104 is disposed at the ground level LV1 on the semiconductor substrate 102, while all the sense amplifier units 106 are disposed on the second level LV2 above the ground level circuitry 104. In the exemplary embodiment, the memory cells (MC1~MC10) are for example, SRAM type memory cells.

Similar to the embodiment of FIG. 8A, the semiconductor device shown in FIG. 9A further includes a plurality of through vias 402 electrically coupling bit lines BL1, BL2 (not shown) of the plurality of stacked memory arrays (MA1~MA10) to each sense amplifier units 106 located at the second level LV2. For example, the through vias 402 extends from the twelfth level LV12 to the second level LV2 and are electrically connecting the bit lines BL1, BL2 of the memory cells (MC1~MC10) located in the same vertical column to the sense amplifier units 106 located at the second level LV2. Further, as similar to the sense amplifier units 106 as described with reference to FIG. 5A and FIG. 5B, amplification and readout functions are integrated in each of the sense amplifier units 106.

Figure 9B:
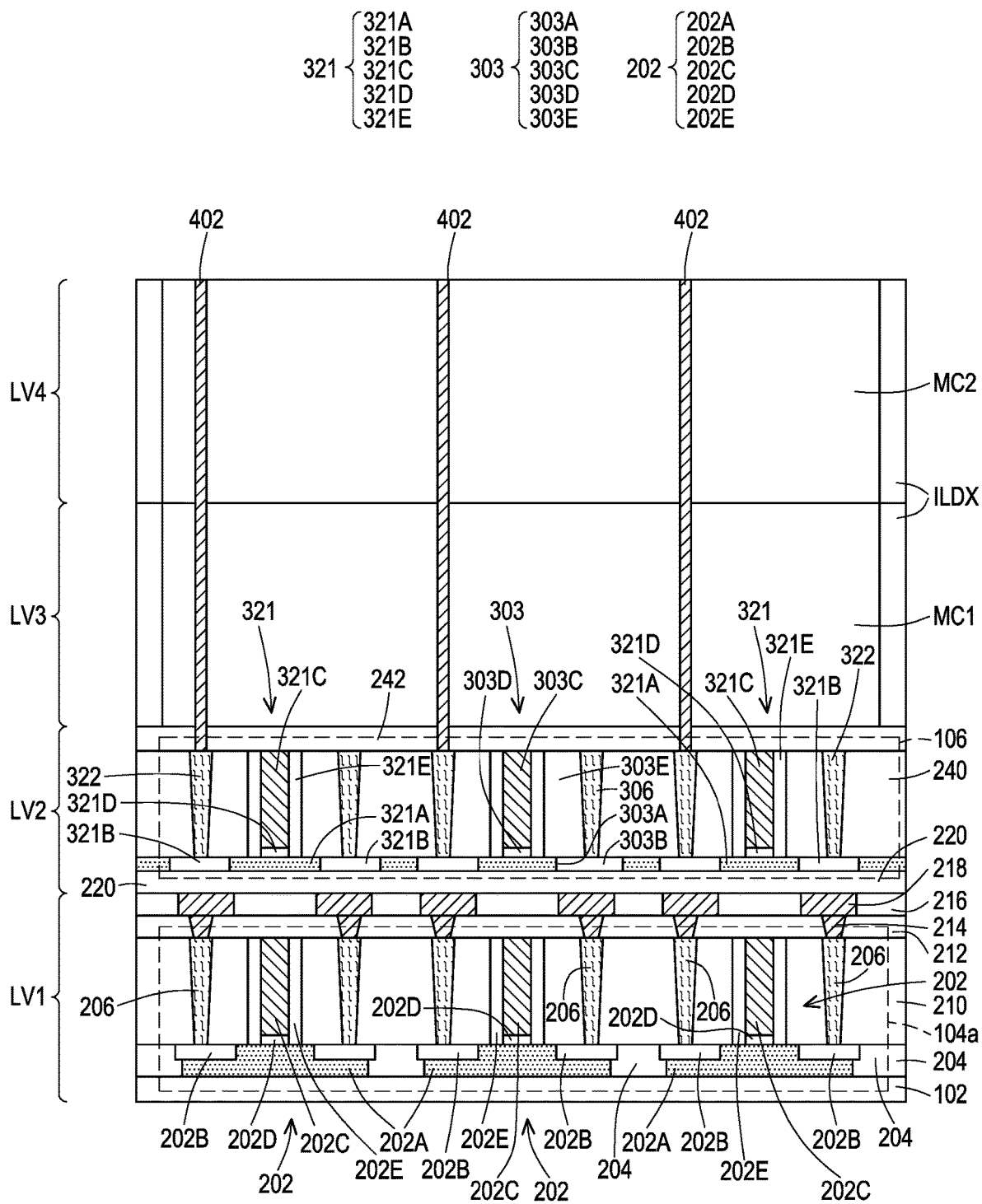
FIG. 9B is an enlarged sectional view of a portion of the semiconductor device shown in FIG. 9A.

FIG. 9B is an enlarged sectional view of a portion of the semiconductor device shown in FIG. 9A. As illustrated in FIG. 9B, the ground level circuitry 104 including logic circuits 104A are disposed at the first level LV1 on the semiconductor substrate 102. For example, the logic circuits 104A includes a plurality of logic transistors 202 disposed on the semiconductor substrate. In some embodiments, the sense amplifier units 106 includes a plurality of sense amplifier transistors 303, 321 (similar to that described in FIG. 7) located at the second level LV2 on the semiconductor substrate 102. For example, the sense amplifier transistors 303, 321 may be overlapped with the logic circuits 104A and electrically coupled to the logic transistors 202.

As further illustrated in FIG. 9B, the first memory cells MC1 are located at the third level LV3 above the sense amplifier units 106, while the second memory cells MC2 are located at the fourth level LV4 above the first memory cells MC1. For example, the first memory cells MC1 and the second memory cells MC2 are overlapped with the sense amplifier units 106 (sense amplifier circuits), and are overlapped with the ground level circuitry 104 (such as the logic circuit 104A). In some embodiments, the through vias 402 extends through the first memory cells MC1 and the second memory cells MC2, and electrically connect the bit lines BL1, BL2 of the memory cells (MC1, MC2) to the sense amplifier transistor 321. Alternatively, the through vias 402 extends through the first memory cells MC1 and the second memory cells MC2, and electrically connect the bit lines BL1, BL2 of the memory cells (MC1, MC2) to the sense amplifier transistor 303.

In the above embodiments, the semiconductor device includes a plurality of sense amplifier units disposed on the semiconductor substrate and electrically coupled to the plurality of stacked memory arrays. At least a portion of each of the sense amplifier units is disposed at the elevated level over the ground level circuitry. As such, by arranging the circuits of the sense amplifier units along with the memory cells at different horizontal levels with the ground level circuitry, connection between the memory cells and the sense amplifier units can be significantly shortened. Therefore, latency of signal traveling between the memory cells and the sense amplifier units can be effectively reduced, and operation speed of the memory cells can be improved. Furthermore, the sense amplifier unit and the memory cells occupy minimal area in the front-end-of-line (FEOL) structure, thus the chip area and costs of the semiconductor device can be reduced to a minimum. As such, a semiconductor device having high speed performance with area shrinkage may be achieved.

In accordance with some embodiments of the present disclosure, a semiconductor device includes a semiconductor substrate, ground level circuitry, a plurality of stacked memory arrays and a plurality of sense amplifier units. The ground level circuitry is disposed on the semiconductor substrate. The stacked memory arrays are disposed at an elevated level over the ground level circuitry. The sense amplifier units are disposed on the semiconductor substrate and electrically coupled to the stacked memory arrays, wherein at least a portion of each of the sense amplifier units is disposed at the elevated level over the ground level circuitry.

In accordance with some other embodiments of the present disclosure, a semiconductor device includes a logic circuit, a plurality of first memory cells and a sense amplifier transistor. The logic circuit includes logic active structures and gate structures. The logic active structures are disposed at a ground level on a semiconductor substrate. The gate structures are disposed at the ground level, wherein the gate structures cover and intersect with the logic active structures. The first memory cells are disposed on the logic circuit at a second level on the semiconductor substrate. The sense amplifier transistors are disposed over the logic circuit at the second level on the semiconductor substrate and electrically coupled to the plurality of first memory cells. The sense amplifier transistor includes a first active structure and a first gate line. The first active structure is disposed at the second level on the semiconductor substrate. The first gate line is disposed at the second level on the semiconductor substrate, wherein the first gate line covers and intersects with the first active structure.

In accordance with yet another embodiment of the present disclosure, a semiconductor device includes a plurality of first memory cells, an interlayer dielectric, a plurality of second memory cells, a first sense amplifier transistor and a second sense amplifier transistor. The first memory cells are disposed on a semiconductor substrate. The interlayer dielectric is disposed on the semiconductor substrate covering the first memory cells. The second memory cells are disposed on the interlayer dielectric above the first memory cells. The first sense amplifier transistor is disposed on the semiconductor substrate aside the first memory cells below the interlayer dielectric. The second sense amplifier transistor is disposed on the interlayer dielectric aside the plurality of second memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
ground level circuitry disposed on the semiconductor substrate;
a plurality of stacked memory arrays disposed at an elevated level over the ground level circuitry; and
a plurality of sense amplifier units disposed on the semiconductor substrate and electrically coupled to the plurality of stacked memory arrays, wherein at least a portion of each of the plurality of sense amplifier units is disposed at the elevated level over the ground level circuitry,
wherein each of the plurality of stacked memory arrays comprises an array of memory cells respectively having at least one field effect transistor, and
wherein the ground level circuitry, the plurality of stacked memory arrays and the plurality of sense amplifiers are embedded in a single semiconductor chip.

2. The semiconductor device according to claim 1, wherein each of the plurality of sense amplifier units comprises:
an amplifying circuit for amplifying signals received from the plurality of stacked memory arrays, wherein the amplifying circuit is disposed at the elevated level over the ground level circuitry; and
a main circuit disposed on the semiconductor substrate aside the ground level circuitry, wherein the main circuit performs read operation of the signals received from the plurality of stacked memory arrays, and the main circuit is electrically coupled to the plurality of stacked memory arrays through the amplifying circuit.

3. The semiconductor device according to claim 2, wherein the amplifying circuit is disposed above the main circuit, and located aside each of the plurality of stacked memory arrays.

4. The semiconductor device according to claim 2, wherein the amplifying circuit is disposed above the main circuit, and located below the plurality of stacked memory arrays.

5. The semiconductor device according to claim 4, further comprising a plurality of through vias electrically coupling bit lines of the plurality of stacked memory arrays to the amplifying circuit of each of the plurality of sense amplifier units.

6. The semiconductor device according to claim 1, wherein the plurality of sense amplifier units is entirely disposed at the elevated level aside each of the plurality of stacked memory arrays, and wherein one of the plurality of stacked memory arrays is connected to a group of the sense amplifier units laterally adjacent to and located at the same height as the one of the plurality of stacked memory arrays.

7. The semiconductor device according to claim 1, wherein the plurality of sense amplifier units is entirely disposed at the elevated level in between the plurality of stacked memory arrays and the ground level circuitry.

8. A semiconductor device; comprising:
a logic circuit, comprising:
logic active structures disposed at a ground level on a semiconductor substrate;
gate structures disposed at the ground level, wherein the gate structures cover and intersect with the logic active structures;
a plurality of first memory cells disposed on the logic circuit at a second level on the semiconductor substrate;
a sense amplifier transistor disposed over the logic circuit at the second level on the semiconductor substrate and electrically coupled to the plurality of first memory cells, wherein the sense amplifier transistor comprises:
a first active structure disposed at the second level on the semiconductor substrate; and
a first gate line disposed at the second level on the semiconductor substrate, wherein the first gate line covers and intersects with the first active structure,
wherein the logic circuit, the plurality of first memory cells and the sense amplifier transistor are embedded in a single semiconductor chip.

9. The semiconductor device according to claim 8, wherein the plurality of first memory cells include at least one bit line that is electrically coupled to the sense amplifier transistor.

10. The semiconductor device according to claim 8, wherein the sense amplifier transistor further comprises source/drain regions, wherein a height of the source/drain regions is equal to a height of the first active structure.

11. The semiconductor device according to claim 8, further comprising a second sense amplifier transistor disposed aside the logic circuit at the ground level on the semiconductor substrate, wherein the second amplifier transistor comprises:
a second active structure disposed at the ground level on the semiconductor substrate aside the logic active structure; and
a second gate line disposed at the ground level on the semiconductor substrate, wherein the second gate line covers and intersects with the second active structure.

12. The semiconductor device according to claim 11, wherein the second amplifier transistor further comprises source/drain regions, and a height of the source/drain regions is smaller than a height of the second active structure.

13. The semiconductor device according to claim 11, wherein source/drain regions of the sense amplifier transistor at the second level is electrically coupled to source/drain regions of the second sense amplifier transistor at the ground level.

14. The semiconductor device according to claim 8, further comprising:
a plurality of second memory cells disposed on the plurality of first memory cells at a third level on the semiconductor substrate above the second level; and
a third level sense amplifier transistor disposed at the third level on the semiconductor substrate and electrically coupled to the plurality of second memory cells.

15. The semiconductor device according to claim 14, further comprising a plurality of second sense amplifier transistors disposed aside the logic circuit at the ground level on the semiconductor substrate, wherein the plurality of second sense amplifier transistors is electrically coupled to the sense amplifier transistor and the third level sense amplifier transistor.

16. A semiconductor device, comprising:
a plurality of first memory cells disposed on a semiconductor substrate;
an interlayer dielectric disposed on the semiconductor substrate covering the plurality of first memory cells;

a plurality of second memory cells disposed on the interlayer dielectric above the plurality of first memory cells;

a first sense amplifier transistor disposed on the semiconductor substrate aside the plurality of first memory cells below the interlayer dielectric; and a second sense amplifier transistor disposed above the interlayer dielectric aside the plurality of second memory cells, wherein the plurality of first memory cells, the interlayer dielectric, the plurality of second memory cells, the first sense amplifier transistor and the second sense amplifier transistor are embedded in a single semiconductor chip.

17. The semiconductor device according to claim 16, further comprising ground level sense amplifier transistors disposed on the semiconductor substrate below the plurality of first memory cells, wherein the ground level sense amplifier transistors are electrically coupled to the first sense amplifier transistor and the second sense amplifier transistor.

18. The semiconductor device according to claim 16, further comprising word line drivers and logic circuits disposed on the semiconductor substrate below the plurality of first memory cells.

19. The semiconductor device according to claim 16, wherein the plurality of first memory cells comprises first memory active structures, and the first sense amplifier transistor comprises first active structures, and wherein the first memory active structures and the first active structures are located at the same level over the semiconductor substrate and have equal heights.

20. The semiconductor device according to claim 16, wherein the plurality of first memory cells and the plurality of second memory cells are dynamic random access memory (DRAM) type memory cells, static random access memory (SRAM) type memory cells or flash type memory cells.

* * * * *